United States Patent
Aoki

(10) Patent No.: US 11,742,559 B2
(45) Date of Patent: Aug. 29, 2023

(54) MULTILAYER TRANSMISSION LINE INCLUDING FIRST AND SECOND TRANSMISSION LINES ON OPPOSITE SURFACES OF A MULTILAYER SUBSTRATE AND WHICH ARE ELECTRICALLY CONNECTED BY A CYLINDRICAL CONDUCTOR HOLE

(71) Applicant: DENSO CORPORATION, Kariya (JP)

(72) Inventor: Kazuhiro Aoki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/034,345

(22) Filed: Sep. 28, 2020

(65) Prior Publication Data

US 2021/0013573 A1    Jan. 14, 2021

Related U.S. Application Data

(63) Continuation of application No. PCT/JP2019/013711, filed on Mar. 28, 2019.

(30) Foreign Application Priority Data

Mar. 30, 2018 (JP) ................. 2018-068270

(51) Int. Cl.
*H01P 5/107* (2006.01)
*H01P 3/08* (2006.01)

(52) U.S. Cl.
CPC .............. *H01P 5/107* (2013.01); *H01P 3/088* (2013.01)

(58) Field of Classification Search
CPC ................. H01P 5/107; H01P 5/087

USPC ......................................... 333/26
See application file for complete search history.

(56) References Cited

U.S. PATENT DOCUMENTS

| | | | |
|---|---|---|---|
| 3,150,336 A | * | 9/1964 | Gonda ............. H01P 5/08 333/33 |
| 6,870,438 B1 | | 3/2005 | Shino et al. |
| 2007/0052504 A1 | | 3/2007 | Fujita |
| 2011/0138619 A1 | | 6/2011 | Dayan et al. |
| 2011/0227667 A1 | | 9/2011 | Uchimura |
| 2013/0057365 A1 | | 3/2013 | Mizushima et al. |
| 2015/0357698 A1 | | 12/2015 | Kushta |
| 2016/0336654 A1 | | 11/2016 | Aoki et al. |

FOREIGN PATENT DOCUMENTS

| | | |
|---|---|---|
| JP | 2002-16408 A | 1/2002 |
| JP | 2004187281 A | 7/2004 |
| JP | 2014-165529 A | 9/2014 |

\* cited by examiner

*Primary Examiner* — Benny T Lee
(74) *Attorney, Agent, or Firm* — Maschoff Brennan

(57) ABSTRACT

A multilayer transmission line includes a multilayer substrate. The multilayer substrate includes a plurality of conductor layers stacked in a predetermined direction with dielectric layers interposed therebetween. The conductor layers in an inner layer part include ground planes, respectively. The inner layer part includes a conductor hole part. The conductor hole part is provided penetrating the respective ground planes in the inner layer part in the predetermined direction. The conductor hole part includes a conductor part to electrically connect the ground planes together. The conductor layer in an outer layer part includes a transmission line and a conversion part. The outer layer part includes the conductor layer as the outermost layer and an inner conductor layer.

4 Claims, 8 Drawing Sheets

<EIGHTH LAYER (L8)>

<FIRST LAYER (L1)>

<EIGHTH LAYER (L8)>

MULTILAYER TRANSMISSION LINE INCLUDING FIRST AND SECOND TRANSMISSION LINES ON OPPOSITE SURFACES OF A MULTILAYER SUBSTRATE AND WHICH ARE ELECTRICALLY CONNECTED BY A CYLINDRICAL CONDUCTOR HOLE

CROSS-REFERENCE TO RELATED APPLICATIONS

This application is the U.S. bypass application of International Application No. PCT/JP2019/013711 filed on Mar. 28, 2019 which designated the U.S. and claims priority to Japanese Patent Application No. 2018-068270 filed on Mar. 30, 2018, the contents of both of which are incorporated herein by reference.

TECHNICAL FIELD

The present disclosure relates to a technique using a multilayer substrate to transmit a signal.

BACKGROUND

JP 2014-165529 A discloses a multilayer transmission line substrate including a metal hole formation layer having a metal hole formed along a stacking direction and serving as a waveguide, and an outermost conductor layer stacked on the metal hole formation layer with a dielectric layer in between.

SUMMARY

A multilayer transmission line according to one aspect of the disclosure includes a multilayer substrate. The multilayer substrate includes n conductor layers from a first layer to an nth (n is a natural number of 5 or more) layer stacked in a predetermined direction with dielectric layers interposed therebetween. Each of the conductor layers in an inner layer part from an n1th (n1 is a natural number larger than 1) layer to an n2th (n2 is a natural number larger than n1 and smaller than n) layer includes a ground plane.

The inner layer part includes a conductor hole part. The conductor hole part is provided penetrating the respective ground planes in the inner layer part in the predetermined direction, has a cylindrical shape, and has a conductor part to electrically connect the ground planes together.

The conductor layer of each of the first and nth layers as two outermost layers of the multilayer substrate includes a transmission line and a conversion part.

The conversion part is provided overlapping the conductor hole part in the predetermined direction and configured to convert respective transmission modes of the transmission line and the conductor hole part to propagate power between the transmission line and the conductor hole part.

The multilayer substrate includes a first outer layer part including the first-layer conductor layer stacked on an n1th layer side with respect to the inner layer part and a second outer layer part including the nth-layer conductor layer stacked on an n2th layer side with respect to the inner layer part, and at least one of the first and second outer layer parts includes the conductor layer as the outermost layer and an inner conductor layer as the conductor layer opposed to the conductor layer as the outermost layer with a dielectric layer in between.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
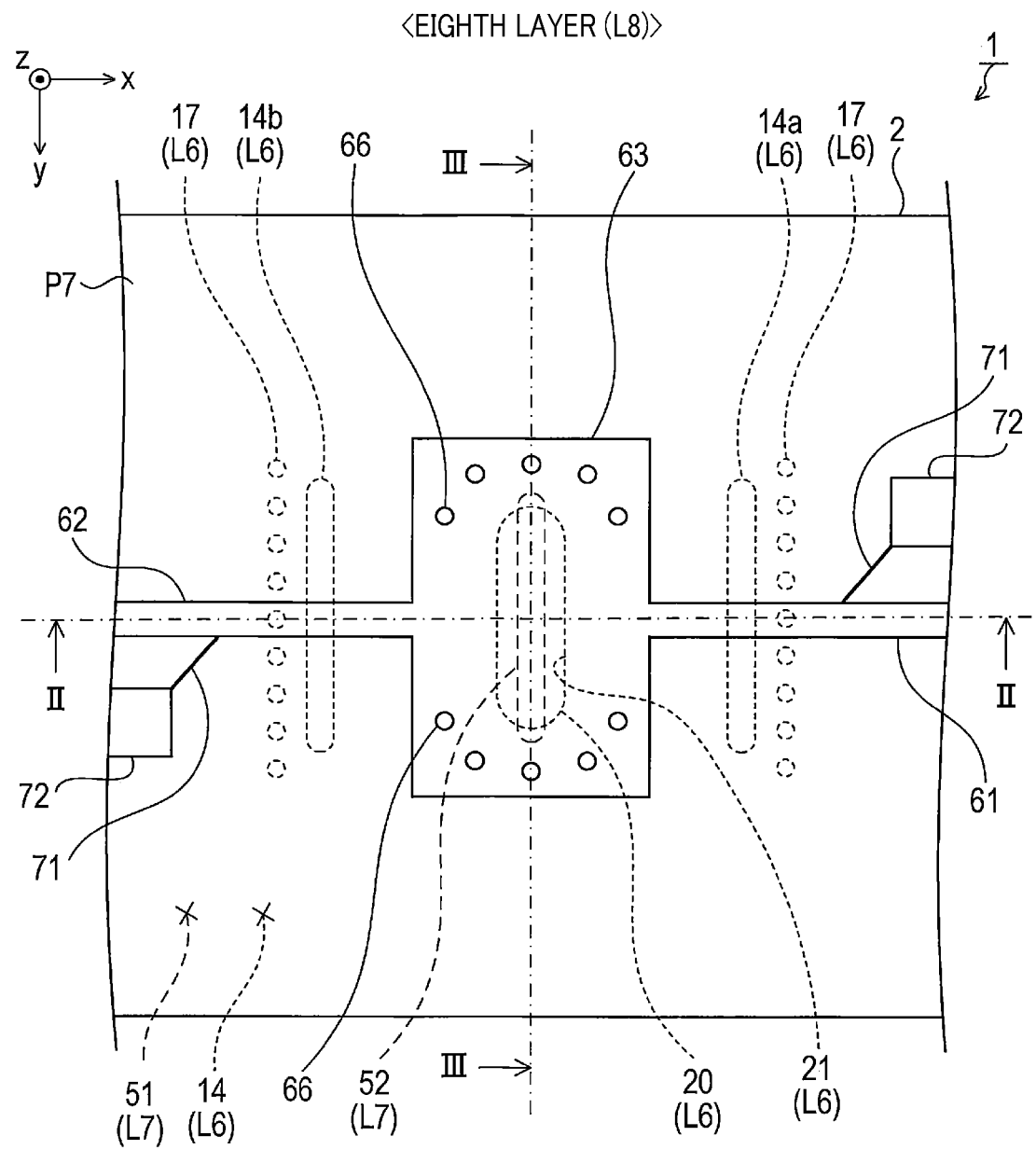
FIG. 1 is a top view of a multilayer transmission line of a first embodiment.

In the multilayer transmission line substrate disclosed in JP 2014-165529 A, a transmission line is formed in the outermost conductor layer and in conjunction with the metal hole transmits a high-frequency signal through the metal hole from one surface to the other surface of the multilayer transmission line substrate.

When one outermost conductor layer is stacked on the metal hole formation layer with one dielectric layer in between as with the above-described multilayer transmission line substrate, a prepreg is typically used as the dielectric layer and allows the outermost conductor layer to adhere to the metal hole formation layer.

However, as a result of detailed investigation by the inventors, the following disadvantage has been found: Spacing between the outermost conductor layer and the second-outermost conductor layer (hereinafter, referred to as "outermost layer-to-conductor spacing") is less likely to be accurately controlled by the method of using the prepreg to allow the outermost conductor layer to adhere to the metal hole formation layer. In the multilayer transmission line substrate, the second-outermost conductor layer corresponds to a conductor layer on the surface of the metal hole formation layer.

Transmission characteristics of a high-frequency signal transmitted along the outermost conductor layer and operations of circuit elements (for example, antenna) formed in the outermost conductor layer are affected by accuracy of the outermost layer-to-conductor spacing. That is, a reduction in accuracy of the outermost layer-to-conductor spacing may cause a difficulty in maintaining good transmission characteristics of the high-frequency signal transmitted along the outermost conductor layer, or cause a deterioration in operation performance of each circuit element formed in the outermost conductor layer.

One aspect of the disclosure is to provide a technique using a multilayer substrate including an inner layer part having a conductor hole part serving as a waveguide and a conductor layer stacked on the inner layer part to successfully transmit a signal through the conductor hole part between the two sides of the multilayer substrate.

A multilayer transmission line according to one embodiment of the disclosure includes a multilayer substrate. The multilayer substrate includes n conductor layers from a first layer to an nth (n is a natural number of 5 or more) layer stacked in a predetermined direction with dielectric layers interposed therebetween. Each of the conductor layers in an inner layer part from an n1th (n1 is a natural number larger than 1) layer to an n2th (n2 is a natural number larger than n1 and smaller than n) layer includes a ground plane.

The inner layer part includes a conductor hole part. The conductor hole part is provided penetrating the respective ground planes in the inner layer part in the predetermined direction, has a cylindrical shape, and has a conductor part to electrically connect the ground planes together.

The conductor layer of each of the first and nth layers as two outermost layers of the multilayer substrate includes a transmission line and a conversion part.

The conversion part is provided overlapping the conductor hole part in the predetermined direction and configured to convert respective transmission modes of the transmission line and the conductor hole part to propagate power between the transmission line and the conductor hole part.

The multilayer substrate includes a first outer layer part including the first-layer conductor layer stacked on an n1th layer side with respect to the inner layer part and a second outer layer part including the nth-layer conductor layer stacked on an n2th layer side with respect to the inner layer part, and at least one of the first and second outer layer parts includes the conductor layer as the outermost layer and an inner conductor layer as the conductor layer opposed to the conductor layer as the outermost layer with a dielectric layer in between.

In a multilayer transmission line configured in this way, at least one (hereinafter, referred to as "multilayer outer layer part") of the first and second outer layer parts has a plurality of conductor layers including the conductor layer, which is the outermost layer, and the inner conductor layer.

In case of stacking one conductor layer on the inner layer part with a dielectric layer in between, the outermost layer-to-conductor spacing is less likely to be accurately maintained as described above. On the other hand, when the multilayer outer layer part is stacked on the inner layer part, it is, for example, possible that a stacked body is beforehand produced so that the conductor layer as the outermost layer and the inner conductor layer are stacked with a dielectric layer in between, and the stacked body is stacked on the inner layer part with a dielectric layer (for example, prepreg) in between. It is therefore possible to accurately maintain the outermost layer-to-conductor spacing in the multilayer outer layer part.

The multilayer transmission line of the present disclosure therefore makes it possible to successfully transmit a signal through a conductor hole part between two sides of a multilayer substrate.

Hereinafter, some exemplary embodiments of the disclosure will be described with reference to the drawings.

1. First Embodiment 1-1 Overall Configuration of Multilayer Transmission Line

A multilayer transmission line 1 of a first embodiment is now described with reference to FIGS. 1 to 6. As illustrated in FIGS. 1 to 6, the multilayer transmission line 1 of the first embodiment includes a multilayer substrate 2. The multilayer substrate 2 includes eight conductor layers L1 to L8 from a first layer to an eighth layer stacked in a predetermined direction (hereinafter, referred to as "stacking direction"). The first-layer conductor layer L1 and the eighth-layer conductor layer L8 are each a conductor layer as an outermost layer exposed to the outside in the multilayer substrate 2.

In the first embodiment, as illustrated in FIGS. 1 to 6, three directions x, y, and z orthogonal to one another in a three-dimensional space are defined for the multilayer substrate 2. The predetermined direction, or the stacking direction in which the conductor layers L1 to L8 are stacked, is the z direction.

Figure 2:
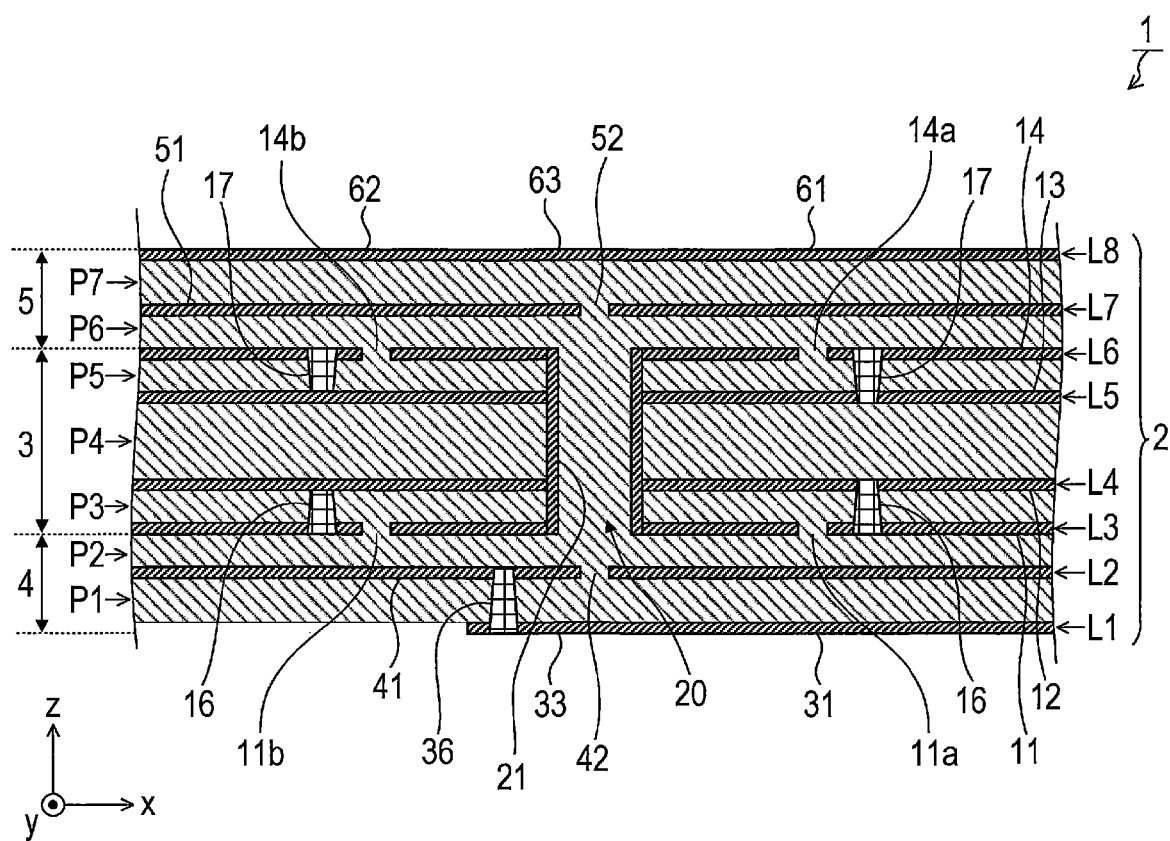
FIG. 2 is a sectional view taken along a line II-II shown in FIG. 1 of the multilayer transmission line of the first embodiment.
Figure 3:
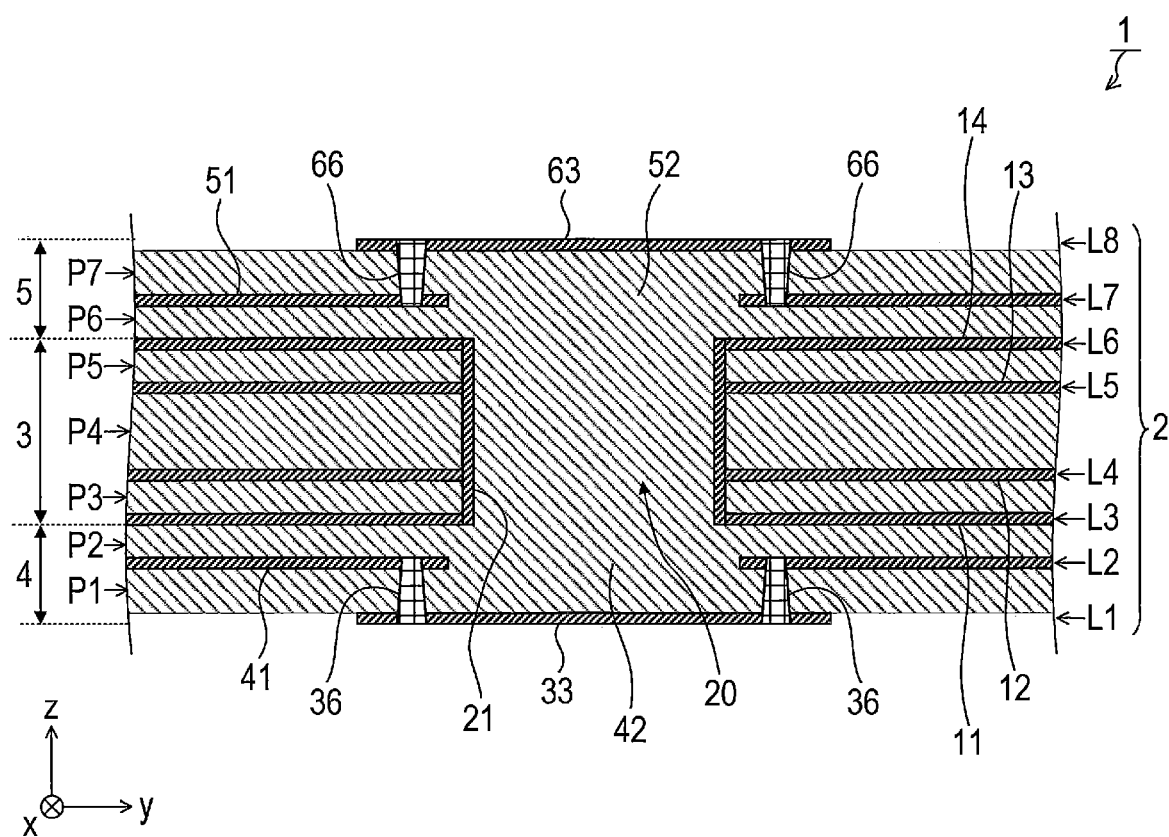
FIG. 3 is a sectional view taken along a line shown in FIG. 1 of the multilayer transmission line of the first embodiment.

As shown in FIGS. 2 and 3, the conductor layers L1 to L8 are sequentially stacked with the dielectric layers interposed therebetween. Specifically, a dielectric layer P1 is interposed between the first-layer conductor layer L1 and the second-layer conductor layer L2. A dielectric layer P2 is interposed between the second-layer conductor layer and the third-layer conductor layer L3. A dielectric layer P3 is interposed between the third-layer conductor layer L3 and the fourth-layer conductor layer L4. A dielectric layer P4 is interposed between the fourth-layer conductor layer L4 and the fifth-layer conductor layer L5. A dielectric layer P5 is interposed between the fifth-layer conductor layer L5 and the sixth-layer conductor layer L6. A dielectric layer P6 is interposed between the sixth-layer conductor layer L6 and the seventh-layer conductor layer L7. A dielectric layer P7 is interposed between the seventh-layer conductor layer r L7 and the eighth-layer conductor layer L8.

In the first embodiment, the dielectric layers P1 to P7 are formed of the same material (for example, a resin material having a predetermined dielectric constant). However, the dielectric layers P1 to P7 may not include the same material (in other words, may not have the same dielectric constant). For example, the dielectric layers can be designed such that the dielectric layer P1 is formed of a material having a dielectric constant εa, the dielectric layer P7 is formed of a material having a dielectric constant εb different from εa, and the dielectric layers P2 to P6 are each formed of a material having a dielectric constant cc different from each of the dielectric constants εa and εb.

As shown in FIGS. 2 and 3, the multilayer substrate 2 is divided into three regions in the stacking direction. Specifically, the multilayer substrate 2 includes an inner layer part 3, a first outer layer part 4, and a second outer layer part 5.

The inner layer part 3 includes two conductor layers which are not exposed to the outside of the multilayer substrate 2 among the conductor layers L1 to L8 in the multilayer substrate 2 and includes a region between the two conductor layers. The inner layer part 3 of the first embodiment includes the third to sixth conductor layers L3 to L6 and the dielectric layers P3 to P5 interposed between respective two of the conductor layers L3 to L6.

As described later, the inner layer part 3 has a conductor hole part 20 penetrating the inner layer part 3 along the stacking direction. The conductor hole part 20 defines part of a transmission path along which a high-frequency signal is transmitted in the multilayer transmission line 1. The high frequency signal is converted into electromagnetic waves and propagated in the conductor hole part 20.

The first outer layer part 4 is stacked on a third layer side with respect to the inner layer part 3 in the multilayer substrate 2. That is, the first outer layer part 4 includes the first-layer conductor layer L1 as the outermost layer and further includes a region from the conductor layer L1 to a boundary with the inner layer part 3 (i.e., boundary with the third-layer conductor layer L3). The first outer layer part 4 of the first embodiment includes the first-layer conductor layer L1 and the second-layer conductor layer L2 and the dielectric layers P1 and P2 stacked on the conductor layers L1 and L2, respectively. That is, the first outer layer part 4 includes the first-layer conductor layer L1 as the outermost layer and the second-layer conductor layer L2 (hereinafter, referred to as "inner conductor layer L2") opposed to the conductor layer L1 with the dielectric layer P1 in between.

The second outer layer part 5 is stacked on a sixth layer side with respect to the inner layer part 3 in the multilayer substrate 2. That is, the second outer layer part 5 includes the eighth-layer conductor layer L8 as the outermost layer and further includes a region from the conductor layer L8 to a boundary with the inner layer part 3 (i.e., boundary with the sixth-layer conductor layer L6). The second outer layer part 5 of the first embodiment includes the seventh-layer conductor layer L7 and the eighth-layer conductor layer L8 and the dielectric layers P6 and P7 on which the respective conductor layers L7 and L8 are stacked. That is, the second outer layer part 5 includes the eighth-layer conductor layer L8 as the outermost layer and the seventh-layer conductor layer L7 (hereinafter, referred to as "inner conductor layer L7") opposed to the conductor layer L8 with the dielectric layer P7 in between.

Figure 4:
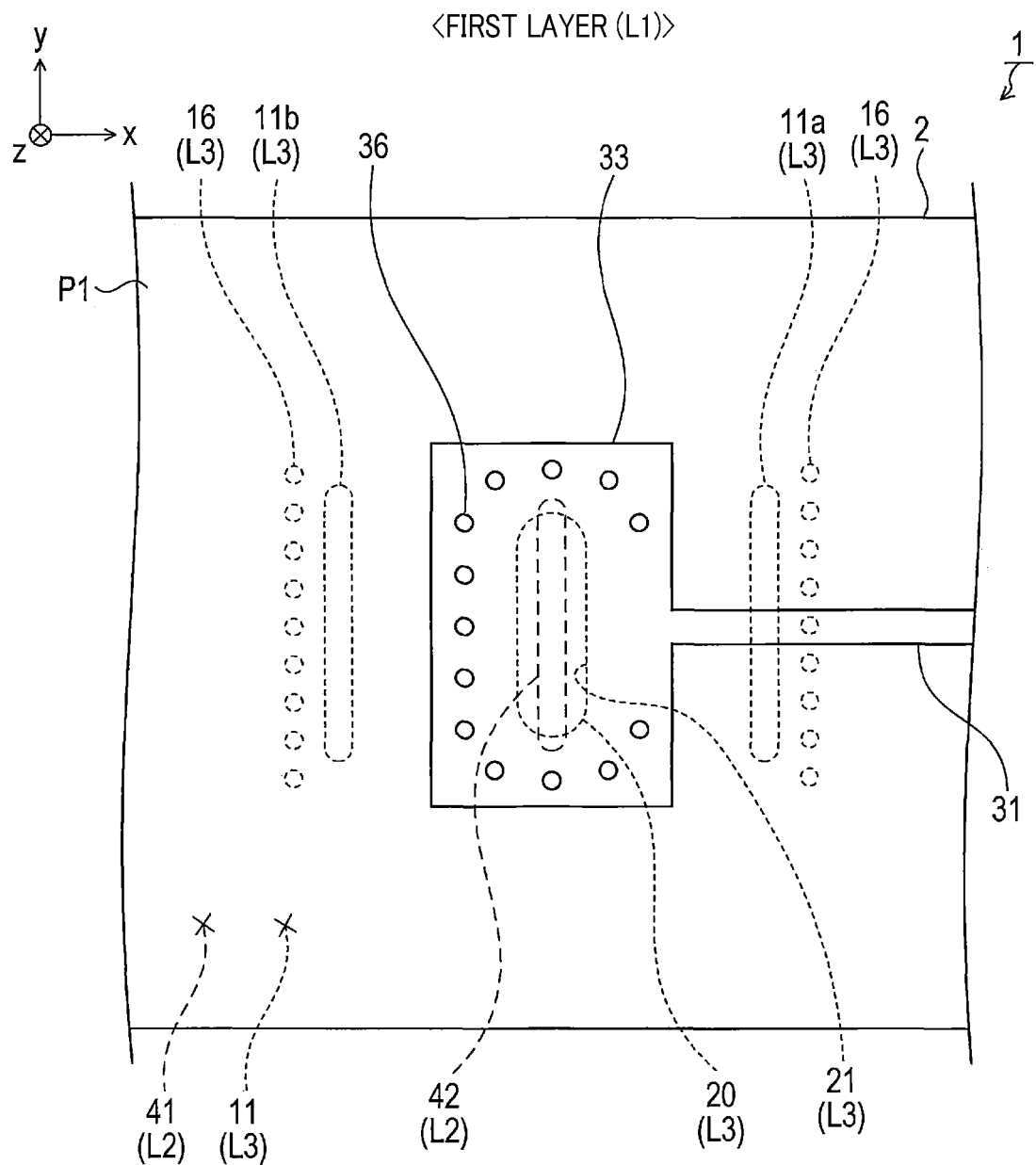
FIG. 4 is a bottom view of the multilayer transmission line of the first embodiment.
Figure 5:
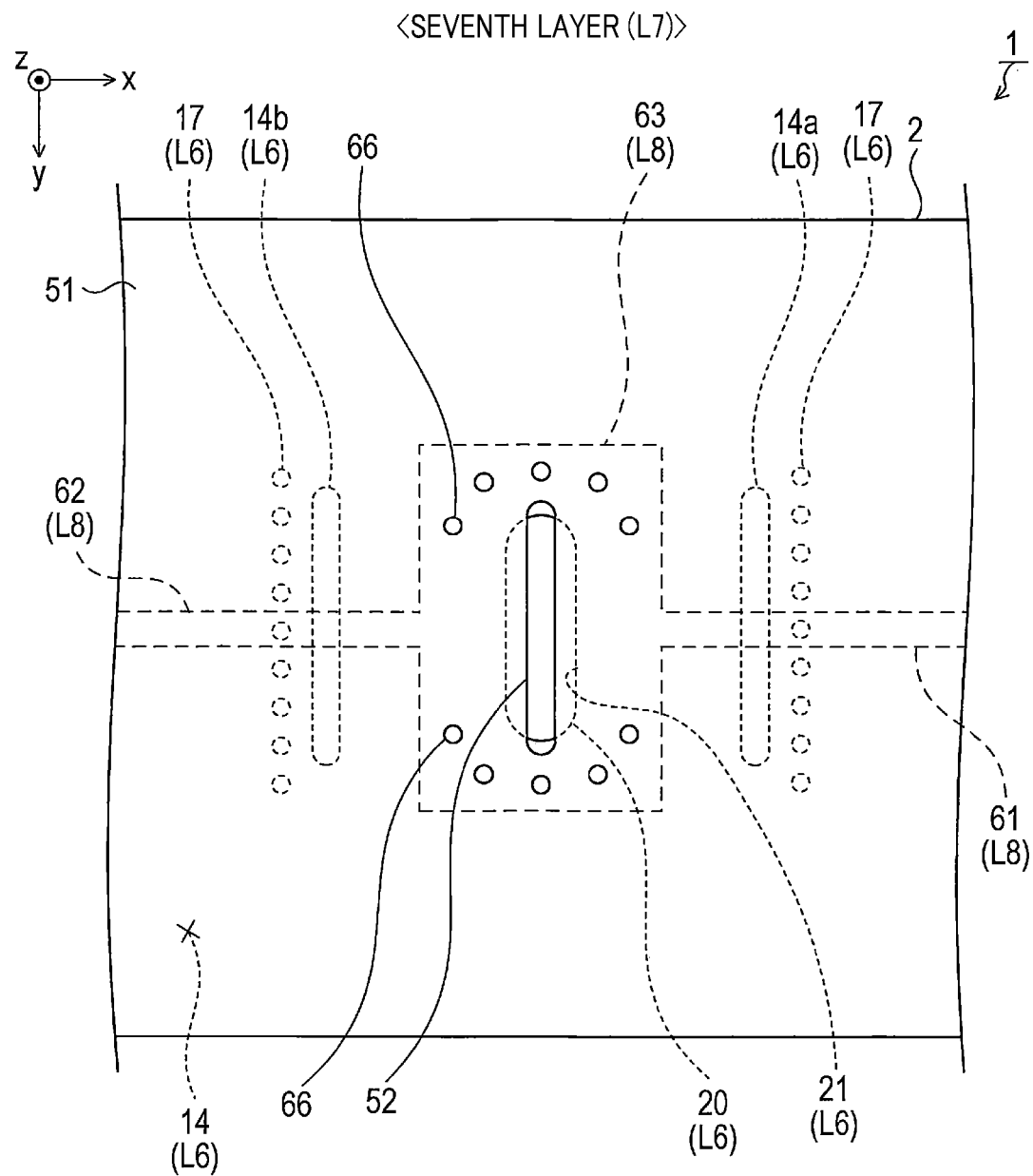
FIG. 5 is a top view of a seventh-layer conductor layer in the multilayer transmission line of the first embodiment.
Figure 6:
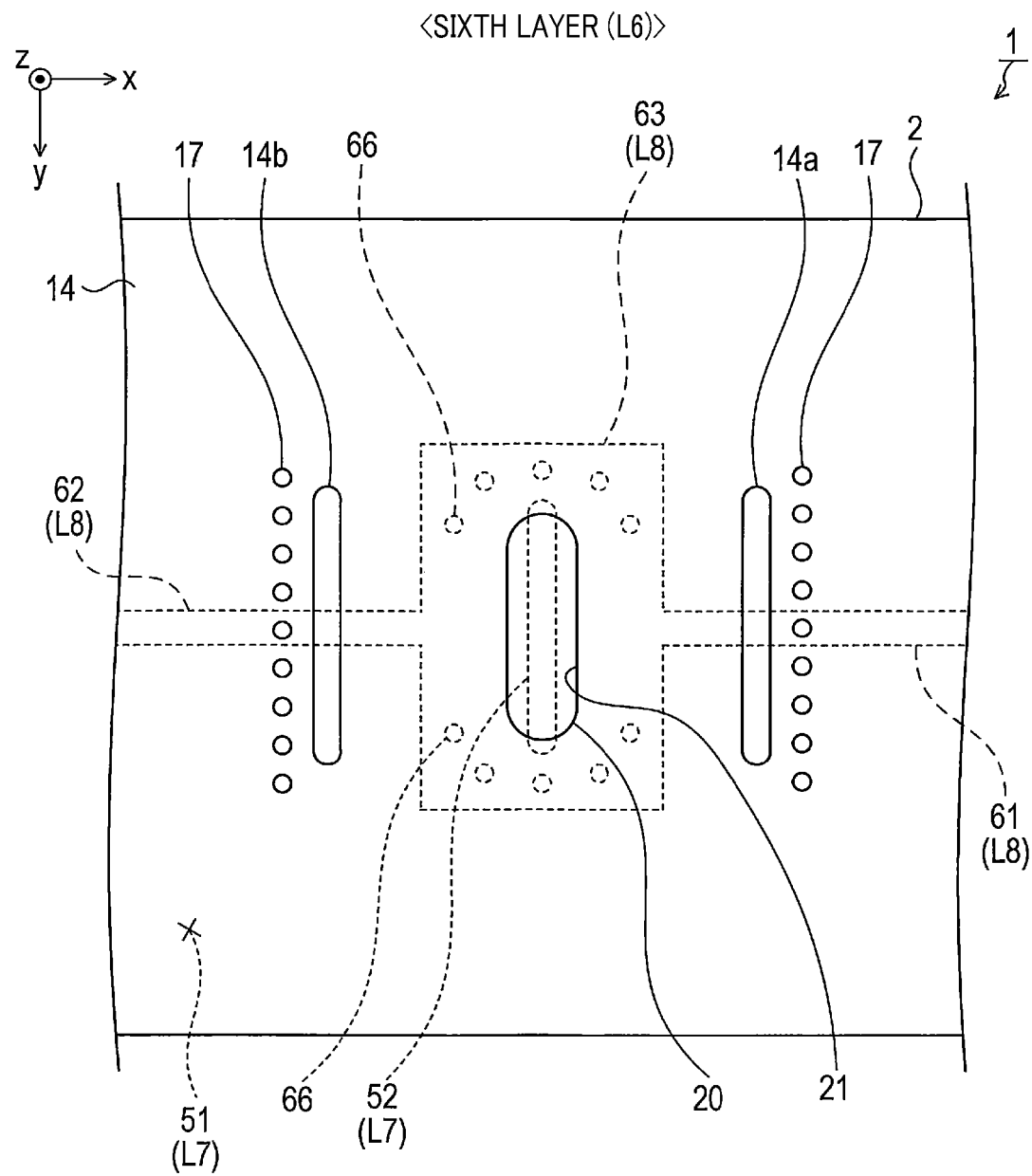
FIG. 6 is a top view of a sixth-layer conductor layer in the multilayer transmission line of the first embodiment.

As shown in FIGS. 2 to 4, a microstrip line 31 and a conversion part 33 are provided in the first-layer conductor layer L1. The microstrip line 31 and the conversion part 33 are each formed of a conductor. The conversion part 33 has a rectangular shape, and is provided overlapping the entire conductor hole part 20 in the stacking direction. The microstrip line 31 is extended in the x direction from a specific portion of the conversion part 33.

The conversion part 33 is configured to propagate power between the microstrip line 31 and the conductor hole 20 by converting the transmission mode between the microstrip line 31 and the conductor hole 20.

A high-frequency signal transmitted to the conversion part 33 through the microstrip line 31 is therefore converted to electromagnetic waves by the conversion part 33 and propagated to the conductor hole part 20. Conversely, electromagnetic waves propagated in the conductor hole part 20 to the conversion part 33 is converted into a high-frequency signal in the conversion part 33 and transmitted to the microstrip line 31.

As shown in FIGS. 1 to 3, microstrip lines 61 and 62 and a conversion part 63 are provided in the eighth-layer conductor layer L8. The microstrip lines 61 and 62 and the conversion part 63 are each formed of a conductor.

The conversion part 63 has the same size and rectangular shape as the first-layer conversion part 33. The conversion part 63 is provided overlapping the entire conductor hole part 20 in the stacking direction as with the first-layer conversion part 33. In the first embodiment, the conversion parts 33 and 63 completely overlap each other when the multilayer transmission line 1 is viewed from the outside in the z direction. When the dielectric layer P1 has a different dielectric constant from the dielectric layer P7, the conversion part 33 accordingly has a different shape or size from the conversion part 63.

However, the conversion parts 33 and 63 need not necessarily be provided completely overlapping each other in the z direction. In addition, each of the conversion parts 33 and 63 may not completely overlap the conductor hole part 20 in the stacking direction.

The microstrip line 61 is extended in the x direction from a specific portion of the conversion part 63. The microstrip line 62 is extended in a direction opposite to the x direction from another specific portion of the conversion part 63. In other words, the microstrip lines 61 and 62 are each extended in a direction parallel to the x direction from the conversion part 63. The microstrip lines 61 and 62 are located at the same position in the y direction.

The conversion part 63 has basically the same function as the first-layer conversion part 33. That is, the conversion part 63 is configured to convert respective transmission modes of the microstrip line 61, the microstrip line 62, and the conductor hole part 20 to propagate power between each of the microstrip lines 61 and 62 and the conductor hole part 20.

A high-frequency signal transmitted to the conversion part 63 through the microstrip lines 61 and 62 is therefore converted to electromagnetic waves by the conversion part 63 and propagated to the conductor hole part 20. Conversely, electromagnetic waves propagated in the conductor hole part 20 to the conversion part 63 are converted into a high-frequency signal in the conversion part 63, and are branched and transmitted from the conversion part 63 to each microstrip line 61, 62.

As illustrated in FIG. 1, in the eighth-layer conductor layer L8, the microstrip lines 61 and 62 are each connected to an antenna element 72 through a feeder line 71. An undepicted communication circuit is provided in the first-layer conductor layer L1 and connected to the microstrip line 31.

A high-frequency signal supplied from the undepicted communication circuit to the microstrip line 31 is then transmitted from the microstrip line 31 to the conversion part 33 and then converted to an electromagnetic wave by the conversion part 33 for propagation in the z direction through the conductor hole part 20. The electromagnetic wave propagated in the z direction through the conductor hole part 20 is converted to a high-frequency signal by the eighth-layer conversion part 63, and the high-frequency signal is transmitted to the microstrip lines 61 and 62 and radiated in a form of an electromagnetic wave from the respective antenna elements 72.

Upon reception of electromagnetic waves by the respective antenna elements 72, high-frequency signals are sent from the antenna elements 72 to the respective microstrip lines 61 and 62. The high-frequency signals are then transmitted from the microstrip lines 61 and 62 to the conversion part 63. The high-frequency signals are mixed and converted to an electromagnetic wave by the conversion part 63, and the electromagnetic wave is propagated through the conductor hole part 20 in a direction opposite to the z direction. The electromagnetic wave propagated through the conductor hole part 20 is converted to a high-frequency signal by the first-layer conversion part 33, and the high-frequency signal is transmitted to the undepicted communication circuit through the microstrip line 31. The communication circuit performs various types of signal processing on the high-frequency signal received from the microstrip line 31.

1-2 Specific Configuration of Inner Layer Part 3

An electrically-grounded ground plane is provided in each of the conductor layers L3 to L6 in the inner layer part 3. That is, a ground plane 11 is provided in the third-layer conductor layer L3, a ground plane 12 is provided in the fourth-layer conductor layer L4, a ground plane 13 is provided in the fifth-layer conductor layer L5, and a ground plane 14 is provided in the sixth-layer conductor layer L6. The ground planes 11 to 14 are each formed of a conductor.

The inner layer part 3 has the conductor hole part 20 electrically serving as a waveguide. The conductor hole part 20 has a cylindrical shape extended along the stacking direction (z direction).

The conductor hole part 20 is provided penetrating the ground planes 11 to 14 in the inner layer part 3 in the stacking direction. The conductor hole part 20 includes a conductor part 21.

The conductor part 21 is provided so as to be connected to each of the ground planes 11 to 14. The ground planes 11 to 14 are electrically connected together by the conductor part 21 (i.e., by the conductor hole part 20). In the first embodiment, the conductor part 21 is provided over the entire inner periphery of the cylindrical conductor hole part 20. The sectional shape of the conductor hole part 20 of the first embodiment is, for example, an elliptic shape having a length longer in the y direction than in the x direction.

A slit is provided in the outermost conductor layer in the inner layer part 3, i.e., in each of the third and sixth conductor layers L3 and L6.

Specifically, the third-layer conductor layer L3 has two slits 11a and 11b. The slits 11a and 11b are each formed by opening part of the ground plane 11 provided in the third-layer conductor layer L3.

The slits 11a and 11b are provided in the third-layer conductor layer L3 at symmetrical positions with respect to the conductor hole part 20. More specifically, the slit 11a is provided at a position a predetermined distance away from the conductor hole part 20 in the x direction, while the slit 11b is provided at a position a predetermined distance away from the conductor hole part 20 in the direction opposite to the x direction.

Each of the slits 11a and 11b has an elongated hole shape extending in the y direction. The slits 11a and 11b and the conductor hole part 20 each have an elongated hole shape and are each provided extending in the y direction.

Each of the slits 11a and 11b suppresses the electromagnetic wave propagating between the conductor hole part 20 and the first-layer conversion part 33 from leaking along the third layer (i.e., in a direction parallel to the x-y plane) into between the third layer and the second layer.

A plurality of inner layer vias 16 are provided in the vicinity of each of the slits 11a and 11b. Each inner layer via 16 is a so-called interstitial via hole (IVH) provided to electrically connect the third-layer ground plane 11 to the fourth-layer ground plane 12.

The inner layer vias 16 provided in the vicinity of the slit 11a are arranged at a regular interval along the y direction at positions equidistantly away from the slit 11a in the x direction. The inner layer vias 16 provided in the vicinity of the slit 11b are also arranged at a regular interval along the y direction at positions equidistantly away from the slit 11b in the direction opposite to the x direction.

In the first embodiment, the respective inner layer vias 16 in the vicinity of the slit 11a and the respective inner layer vias 16 in the vicinity of the slit 11b are provided in a symmetrical positional relationship with respect to the conductor hole part 20.

The inner layer vias 16 in the vicinity of the slit 11a enhance the effect of the slit 11a, i.e., help to suppress the leakage of the electromagnetic wave. The inner layer vias 16 in the vicinity of the slit 11b also enhance the effect of the slit 11b, i.e., help to suppress the electromagnetic wave leakage.

The sixth-layer conductor layer L6 has two slits 14a and 14b as with the third layer. The slits 14a and 141b are each formed by opening part of the ground plane 14 provided in the sixth-layer conductor layer L6.

The slits 14a and 14b are provided in the sixth-layer conductor layer L6 at symmetrical positions with respect to the conductor hole part 20. More specifically, the slit 14a is provided at a position a predetermined distance away from the conductor hole part 20 in the x direction, while the slit 14b is provided at a position a predetermined distance away from the conductor hole part 20 in the direction opposite to the x direction.

The respective slits 14a and 14b have the same sizes and shapes and have the same positional relationships with respect to the conductor hole part 20 as the respective slits 11a and 11b provided in the third layer.

Each of the slits 14a and 14b suppresses the electromagnetic wave propagating between the conductor hole part 20 and the eighth-layer conversion part 63 from leaking along the sixth layer (i.e., in a direction parallel to the x-y plane) into between the sixth layer and the seventh layer.

A plurality of inner layer vias 17 are provided in the vicinity of each of the slits 14a and 14b. Each inner layer via 17 is a so-called IVH provided to electrically connect the sixth-layer ground plane 14 to the fifth-layer ground plane 13.

The inner layer vias 17 provided in the vicinity of the slit 14a are arranged at a regular interval along the y direction at positions equidistantly away from the slit 14a in the x direction. The inner layer vias 17 provided in the vicinity of the slit 14b are also arranged at a regular interval along the y direction at positions equidistantly away from the slit 14b in the direction opposite to the x direction.

In the first embodiment, the respective inner layer vias 17 in the vicinity of the slit 14a and the respective inner layer vias 17 in the vicinity of the slit 14b are provided in a symmetrical positional relationship with respect to the conductor hole part 20.

The inner layer vias 17 in the vicinity of the slit 14a enhance the effect of the slit 14a, i.e., helps to suppress the leakage of the electromagnetic wave. The inner layer vias 17 in the vicinity of the slit 14b also enhance the effect of the slit 14b, i.e., helps to suppress the leakage of the electromagnetic wave.

1-3 Specific Configuration of First Outer Layer Part 4

In the first outer layer part 4, the microstrip line 31 and the conversion part 33 are provided in the first-layer conductor layer L1, as described above. An electrically grounded ground plane 41 is provided in the second-layer inner conductor layer L2.

The inner conductor layer L2 has a slit 42 having an electromagnetic radiation function. The electromagnetic radiation function of the slit 42 is a function of radiating the electromagnetic wave propagated from the first-layer conversion part 33 to the conductor hole part 20, and radiating the electromagnetic wave propagated from the conductor hole part 20 to the conversion part 33.

The slit 42 is formed by opening part of the ground plane 41 provided in the second-layer inner conductor layer L2. The slit 42 of the first embodiment has an elongated hole shape like the x-y sectional shape of the conductor hole part 20.

The slit 42 is provided so as to partially, but not completely, overlap the conductor hole part 20 in the stacking direction. More specifically, the slit 42 is longer than the conductor hole part 20 in the y direction. One end in the y direction of the slit 42 further projects in the y direction from the y directional end of the conductor hole part 20. The other end in the direction opposite to the y direction of the slit 42 also further projects in the direction opposite to the y direction from the end in the direction opposite to the y direction of the conductor hole part 20.

A plurality of outer layer vias 36 are provided surrounding the slit 42 in the periphery of the slit 42. However, no outer layer via 36 is provided in the vicinity of the connection portion between the microstrip line 31 and the conversion part 33 in the periphery of the slit 42. In other words, a portion having no outer layer via 36 exists in the vicinity of the connection portion in the slit periphery in which the outer layer vias 36 are provided. Each outer layer via 36 is a so-called IVH provided to electrically connect the first-layer conversion part 33 and the second-layer ground plane 41.

1-4 Specific Configuration of Second Outer Layer Part 5

In the second outer layer part 5, the two microstrip lines 61 and 62 and the conversion part 63 are provided in the eighth-layer conductor layer L8, as described above. An electrically grounded ground plane 51 is provided in the seventh-layer inner conductor layer L7.

The inner conductor layer L7 has a slit 52 having an electromagnetic radiation function. The electromagnetic radiation function of the slit 52 is a function of radiating the electromagnetic wave propagated from the eighth-layer conversion part 63 to the conductor hole part 20, and radiating the electromagnetic wave propagated from the conductor hole part 20 to the conversion part 63.

The slit 52 is formed by opening part of the ground plane 51 provided in the seventh-layer inner conductor layer L7. The slit 52 of the first embodiment has the same size and shape as the slit 42 providing in the second-layer inner conductor layer L2, and is located at the same position as the slit 42 in the stacking direction. A relative positional relationship of the slit 52 in the inner conductor layer L7 and the conductor hole part 20 is the same as the relative positional relationship of the slit 42 in the inner conductor layer L2 and the conductor hole part 20. When the dielectric layer P1 has a different dielectric constant from the dielectric layer P7, the slit 42 accordingly has a different shape or size from the slit 52.

A plurality of outer layer vias 66 are also provided surrounding the slit 52 in the periphery of the slit 52 in the inner conductor layer L7. However, in the periphery of the slit 52, no outer layer via 66 is provided in the vicinity of the connection portion of the microstrip line 61 and the conversion part 63 and in the vicinity of the connection portion of the microstrip line 62 and the conversion part 63. In other words, a portion having no outer layer via 36 exists in the vicinity of each of the above connection portions in the slit periphery in which the outer layer vias 66 are provided. Each outer layer via 66 is a so-called IVH provided to electrically connect the eighth-layer conversion part 63 and the seventh-layer ground plane 51. In the first embodiment, the number of the outer layer vias 66, and the shape, size, and positional relationship with the slit 52 of each outer layer via 66 are the same as the number of the outer layer vias 36, and the shape, size, and positional relationship with the slit 42 of each outer layer via 36 in the first outer layer part 4.

1-5 Effects of First Embodiment

The above-described first embodiment exhibits the following effects (1a) to (1c).

(1a) The first outer layer part 4 includes the first-layer conductor layer L1 as the outermost layer and the second-layer conductor layer (inner conductor layer) L2. Hence, in manufacturing the multilayer transmission line 1, it is, for example, possible to beforehand produce the first outer layer part 4 separately from the inner layer part 3, and stack the first outer layer part 4 on the inner layer part 3 with, for example, a prepreg in between. The prepreg may also be used as the dielectric layer P2 so that the dielectric layer P2 serves as an adhesive for adhesion of the first outer layer part 4 to the inner layer part 3 while electrically serving as a dielectric.

This makes it possible to accurately maintain spacing between the first and second layers in the first outer layer part 4, and in turn maintain a good high-frequency signal transmission characteristic of the first-layer conductor layer L1 or good operation characteristics of various circuit elements provided in the conductor layer L1. As a result, a signal can be successfully transmitted through the conductor hole part 20 between the first and eighth layers in the multilayer transmission line 1.

In the first embodiment, not only the first outer layer part 4 but also the second outer layer part 5 includes the seventh-layer conductor layer (inner conductor layer) L7 in addition to the eighth-layer conductor layer L8 as the outermost layer. This also makes it possible to accurately maintain spacing between the eighth and seventh layers in the second outer layer part 5, and in turn maintain a good high-frequency signal transmission characteristic of the eighth-layer conductor layer L8 or good operation characteristics of various circuit elements (for example, the antenna elements 72) provided in the conductor layer L8. As a result, a signal can be successfully transmitted through the conductor hole part 20 between the first and eighth layers in the multilayer transmission line 1.

(1b) The slit 42 having the electromagnetic wave emission function is provided in the second-layer inner conductor layer L2, and the slit 52 having the electromagnetic wave emission function is also provided in the seventh-layer inner conductor layer L7. It is therefore possible to suppress attenuation of the electromagnetic wave propagated between the conductor hole part 20 and each of the conversion parts 33 and 63.

In addition, each of the slits 42 and 52 is provided so as to partially, but not completely, overlap the conductor hole part 20 in the stacking direction. This makes it possible to enhance the electromagnetic radiation function of each of the slits 42 and 52.

(1c) The slits 11a, 11b and the slits 14a, 14b are provided in the respective outermost conductor layers L3 and L6 in the inner layer part 3 in order to suppress leakage of the electromagnetic wave. It is therefore possible to more effectively suppress attenuation of the electromagnetic wave propagated between the conductor hole part 20 and each of the conversion parts 33 and 63.

In the first embodiment, the slit 42 provided in the second-layer inner conductor layer L2 and the slit 52 provided in the seventh-layer inner conductor layer L7 each correspond to an example of the radiation part of the disclosure. The slits 11a, 11b and the slits 14a, 14b provided in the respective outermost conductor layers L3 and L6 in the inner layer part 3 each correspond to an example of the leakage suppression part of the disclosure. The microstrip lines 31, 61, and 62 each correspond to an example of the transmission line of the disclosure.

2. Second Embodiment

A second embodiment has the same basic configuration as the first embodiment, and is now described in terms of the differences from the first embodiment. The same sign as in the first embodiment indicates the same configuration, and the foregoing description is referred to.

In the first embodiment, the slits 42 and 52 have been each exemplified as the radiation part of the disclosure. On the other hand, in the second embodiment, a conductor patch is alternatively exemplified as the radiation part of the disclosure.

Figure 7:
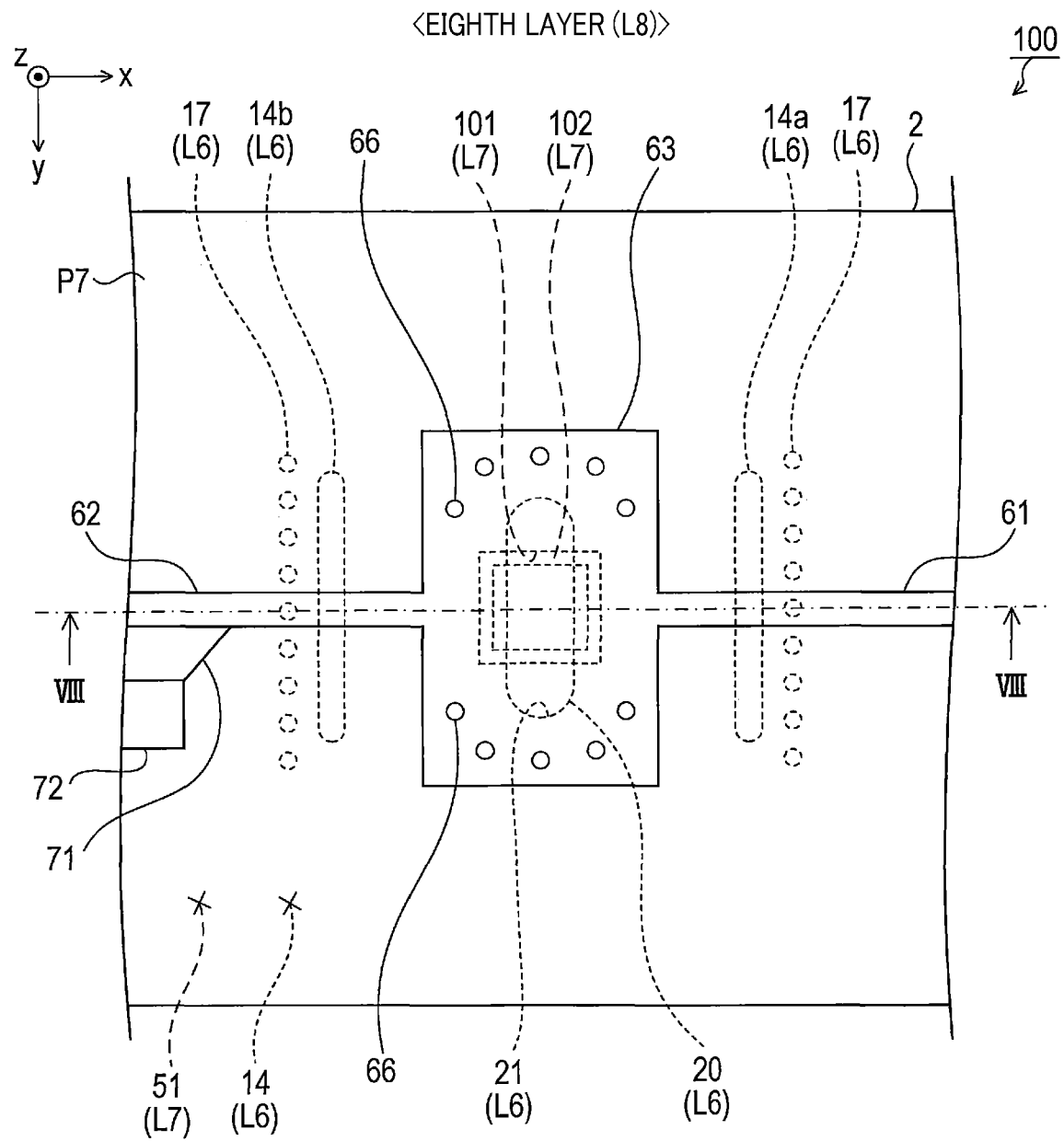
FIG. 7 is a top view of a multilayer transmission line of a second embodiment.
Figure 8:
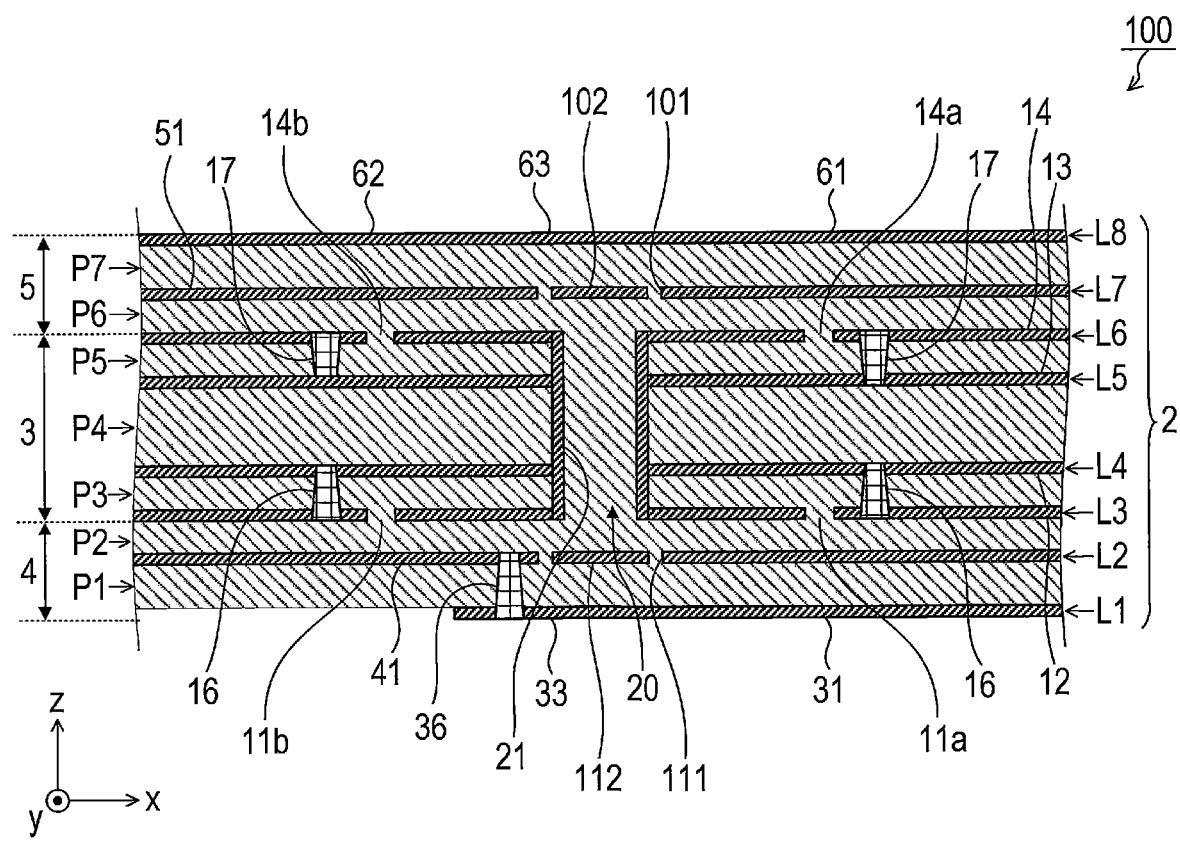
FIG. 8 is a sectional view taken along a line VIII-VIII shown in FIG. 7 of the multilayer transmission line of the second embodiment.

In a multilayer transmission line 100 of the second embodiment as shown in FIGS. 7 and 8, a conductor patch 102 is provided in the inner conductor layer L7 in the second outer layer part 5. More specifically, an opening 101 is provided in the ground plane 51 in the inner conductor layer L7. The conductor patch 102 is disposed in the opening 101. The conductor patch 102 is disposed separately from (in other words, is galvanically isolated from) the ground plane 51 in the opening 101.

The opening 101 has, for example, a rectangular shape, and the conductor patch 102 also has the same rectangular shape as the opening 101. The opening 101 and the conductor patch 102 are each provided so as to partially, but not completely, overlap the conductor hole part 20 in the stacking direction.

In the first outer layer part 4, as illustrated in FIG. 8, a conductor patch 112 is also provided in the inner conductor layer L2. More specifically, an opening 111 is provided in the ground plane 41 in the inner conductor layer L2. The conductor patch 112 is disposed in the opening 111. The conductor patch 112 is arranged apart from the ground plane 41 in the opening 111.

The shapes, sizes, and positions of the respective opening 111 and conductor patch 112 in the inner conductor layer L2 are essentially the same as the shapes, sizes, and positions of the respective opening 101 and conductor patch 102 in the inner conductor layer L7. When the dielectric layer P1 and the dielectric layer P7 have different dielectric constants, at least the conductor patches 112 and 102 or at least the openings 111 and 101 have different shapes or sizes.

The respective conductor patches 102 and 112 have electromagnetic radiation functions as with the respective slits 42 and 52 in the inner conductor layers L2 and L7 in the first embodiment. The multilayer transmission line 100 of the second embodiment therefore exhibits the same effects as the multilayer transmission line of the first embodiment.

3. Other Embodiments

Although some embodiments of the disclosure have been described hereinbefore, the disclosure is not limited thereto, and various modifications may be made.
3-1 Although the slits 42 and 52, each having the sectional shape (in detail, the sectional shape parallel to the x-y plane) of the elongated hole shape, have been each exemplified as the radiation part of the disclosure in the first embodiment, the slits 42 and 52 may each have any other sectional shape. In addition, the sectional shape of the conductor hole part 20 may be not only the elongated hole shape but also any other shape.

A relative positional relationship between each of the slits 42 and 52 and the conductor hole part 20 and a sectional size relationship between the two are also not limited to those as described in the first embodiment.

For example, when the slit 42 is viewed in the stacking direction (z direction) from the outside of the multilayer transmission line 1, the slit 42 may be completely contained in the region of the conductor hole part 20, or conversely the conductor hole part 20 may be completely contained in the region of the slit 42 (i.e., the slit 42 may cover the entire conductor hole part 20), or the slit 42 may overlap only part of the conductor hole part 20.
3-2 Although the conductor patches 102 and 112, each having the sectional shape of the rectangular shape, have been each exemplified as the radiation part of the disclosure in the second embodiment, the conductor patches 102 and 112 may each have any other sectional shape.

A relative positional relationship between each of the conductor patches 102 and 112 and the conductor hole part 20 and a sectional size relationship between the two conductor patches 102 and 112 are also not limited to those as described in the second embodiment.

For example, when the conductor patch 102 is viewed in the stacking direction (z direction) from the outside of the multilayer transmission line 1, the conductor patch 102 may be completely contained in the region of the conductor hole part 20, or conversely the conductor hole part 20 may be completely contained in the region of the conductor patch 102 (i.e., the conductor patch 102 may cover the entire conductor hole part 20), or the conductor patch 102 may overlap only part of the conductor hole part 20.
3-3 Although the slits 11a, 11b and the slits 14a, 14b have been each exemplified as the leakage suppression part of the disclosure in the above-described respective embodiments, the leakage suppression part may have any sectional shape or any size, and may be provided at any position in each outermost conductor layer (each of the third and sixth layers in the embodiments) in the inner layer part 3.

The leakage suppression part may be provided in only one of the two sides of the inner layer part 3. For the inner layer vias 16 and 17 to enhance the effect of the leakage suppression part, the inner layer vias may be provided in any number, may each have any sectional shape, and may be provided in any positional relationship with the leakage suppression part.
3-4 The number of the conductor layers may not be eight but may be any other number of five or more.

Although the number of the conductor layers in the inner layer part 3 has been four in the above-described respective embodiments, the number may be any other number of two or more.

Although the number of the conductor layers has been two in each of the first and second layer parts 4 and 5 in the above-described respective embodiments, the number may be three or more. When the outer layer part has at least three conductor layers, the several inner conductor layers other than the conductor layer as the outermost layer in that outer layer part may each have an opening at a position overlapping the conductor hole part 20 in the z direction. A radiation part (for example, slit) may be provided in the opening of at least one of the inner conductor layers.

Only one of the first and second outer layer parts 4 and 5 may have a plurality of conductor layers while the other has only one conductor layer.
3-5 A plurality of functions exhibited by one component in the above-described respective embodiments may be achieved by a plurality of components, or one function exhibited by one component may be achieved by a plurality of components. A plurality of functions exhibited by a plurality of components may be achieved by one component, or one function achieved by a plurality of components may be achieved by one component. A configuration of one of the embodiments may be partially omitted. At least part of a configuration of one of the embodiments may be added to or substituted for a configuration of another one of the embodiments.

What is claimed is:
1. A multilayer transmission line comprising:
a multilayer substrate including n conductor layers from a first layer to an nth (n is a natural number of 5 or more) layer stacked in a predetermined direction with dielectric layers interposed therebetween, wherein:

the respective conductor layers in an inner layer part from an n1th (n1 is a natural number larger than 1) layer to an n2th (n2 is a natural number larger than n1 and smaller than n) layer include ground planes, in which the n1th layer includes an n1th ground plane and the n2th layer includes an n2th ground plane, the inner layer part includes a cylindrical conductor hole part that penetrates the respective ground planes in the predetermined direction and that has an internal surface that is covered by a cylindrical metal layer to form a conductor part to electrically connect the ground planes together and to facilitate propagation of electromagnetic waves inside of the cylindrical conductor hole in a stacking direction of the layers of the substrate, a first-layer conductor layer of the first layer is a first outermost layer of the multilayer substrate, the first-layer conductor layer including a first transmission line and a first conversion part;

an nth-layer conductor layer of the nth layer is a second outermost layer of the multilayer substrate, the nth-layer conductor layer including a second transmission line and a second conversion part;

the first conversion part overlaps the conductor hole part in the predetermined direction and is configured to convert respective transmission modes of the first transmission line and the conductor hole part to propagate the electromagnetic waves between the first transmission line and the conductor hole part, the second conversion part overlaps the conductor hole part in the predetermined direction and is configured to convert respective transmission modes of the second transmission line and the conductor hole part to propagate the electromagnetic waves between the second transmission line and the conductor hole part, the multilayer substrate includes a first outer layer part including the first-layer conductor layer stacked on an n1th layer side with respect to the inner layer part and a second outer layer part including the nth-layer conductor layer stacked on an n2th layer side with respect to the inner layer part, the first outer layer part includes:
the first-layer conductor layer,
a first inner conductor layer including:
a first ground plane; and
a radiation part configured to radiate a first electromagnetic wave of the electromagnetic waves propagating from the first conversion part to the conductor hole part and radiate a second electromagnetic wave of the electromagnetic waves propagating from the conductor hole part to the first conversion part, the radiation part overlapping the conductor hole part in the predetermined direction, the radiation part having a slit provided in the first ground plane, the slit being provided so as to partially, but not completely, overlap the conductor hole part in the predetermined direction; and
a first dielectric layer between the first-layer conductor layer and the first inner conductor layer; and
the second outer layer part includes:
the nth-layer conductor layer,
a second inner conductor layer, and
a second dielectric layer between the nth-layer conductor layer and the second inner conductor layer.

2. The multilayer transmission line according to claim 1, wherein
at least one of the n1th ground plane or the n2th ground plane respectively has a leakage suppression part configured to suppress leakage of one or more of the electromagnetic waves.

3. The multilayer transmission line according to claim 2, wherein
the leakage suppression part includes a slit different from the slit of the radiation part.

4. The multilayer transmission line according to claim 1, wherein
one or more of the first conversion part or the second conversion part is provided to overlap the entire conductor hole part in the predetermined direction.

* * * * *